United States Patent
Hirsch et al.

(10) Patent No.: US 6,411,911 B1
(45) Date of Patent: Jun. 25, 2002

(54) BATTERY DIAGNOSTIC METHOD UTILIZING A UNIVERSAL NORMALIZED DISCHARGE CURVE FOR PREDICTING BATTERY RESERVE TIME

(75) Inventors: Marc Daniel Hirsch, Dallas; Gregory W. Mathiesen, Rockwall; Patrick Kwok-Yeung Ng, Plano, all of TX (US)

(73) Assignee: Tyco Electronics Logistics AG, Mesquite, TX (US)

( * ) Notice: Subject to any disclaimer, the term of this patent is extended or adjusted under 35 U.S.C. 154(b) by 0 days.

(21) Appl. No.: 09/343,773

(22) Filed: Jun. 30, 1999

(51) Int. Cl.$^7$ .............................................. G01N 27/416
(52) U.S. Cl. .......................... 702/63; 702/81; 702/117; 702/124; 702/177; 702/182; 702/187
(58) Field of Search ............................... 702/57, 63, 64, 702/65, 81, 108, 117, 122, 124–126, 177, 178, 182–185, 187, 188, 198, FOR 103, FOR 104, FOR 105, FOR 106, FOR 111, FOR 112, FOR 134, FOR 135, FOR 141, FOR 154, FOR 170, FOR 171, FOR 173; 700/22, 286, 292, 297; 713/340; 340/636, 660, 663; 324/426, 427, 428, 433; 320/132, 136, 148, 162, 155

(56) References Cited

U.S. PATENT DOCUMENTS

| | | | | |
|---|---|---|---|---|
| 3,969,667 A | * | 7/1976 | McWilliams | 324/29.5 |
| 4,876,513 A | * | 10/1989 | Brilmyer et al. | 324/427 |
| 4,952,862 A | * | 8/1990 | Biagetti et al. | 320/48 |
| 5,608,324 A | * | 3/1997 | Yoshida | 324/426 |
| 5,631,540 A | * | 5/1997 | Nguyen | 320/30 |
| 5,633,574 A | * | 5/1997 | Sage | 320/21 |
| 5,684,404 A | * | 11/1997 | Millar | 324/426 |
| 5,761,072 A | * | 6/1998 | Bardsley, Jr. et al. | 364/483 |
| 5,936,383 A | * | 8/1999 | Ng et al. | 320/132 |
| 5,977,750 A | * | 11/1999 | Ng et al. | 320/132 |
| 6,051,957 A | * | 4/2000 | Klein | 320/132 |
| 6,061,639 A | * | 5/2000 | Wistrand | 702/63 |
| 6,072,300 A | * | 6/2000 | Tsuji | 320/116 |
| 6,137,292 A | * | 10/2000 | Hirsch et al. | 324/427 |
| 6,236,226 B1 | * | 5/2001 | Hagiwara | 324/771 |
| 6,242,891 B1 | * | 6/2001 | Parsonage | 320/132 |
| 6,255,801 B1 | * | 7/2001 | Chalasani | 320/132 |

* cited by examiner

Primary Examiner—Marc S. Hoff
Assistant Examiner—Carol S. W. Tsai
(74) Attorney, Agent, or Firm—Locke Liddell & Sapp LLP

(57) ABSTRACT

A method for monitoring and diagnosing the status of a battery in an electrical system, more particularly, a method for determining a battery's reserve time based on comparison of measurements made during a battery discharge to a universal normalized discharge curve. Specifically, a battery discharge is initiated and the battery's voltage and discharge time is continuously measured. The measured battery voltage is normalized by dividing it by either the peak voltage or foothill voltage, as monitored during the discharge. By comparing this normalized voltage measurement to a universal normalized discharge curve, the percent discharge level of the battery is determined. Using the percent discharge level and the discharge time, the reserve time and total capacity of the battery can be determined.

40 Claims, 9 Drawing Sheets

BATTERY DIAGNOSTIC METHOD UTILIZING A UNIVERSAL NORMALIZED DISCHARGE CURVE FOR PREDICTING BATTERY RESERVE TIME

FIELD OF THE INVENTION

The present invention relates to a method for monitoring and diagnosing the health or status of a battery in an electrical system. More particularly, it is concerned with a method for determining a battery's reserve time by comparing normalized battery voltage and time measurements monitored during a battery discharge to a universal normalized discharge curve.

BACKGROUND OF THE INVENTION

A battery is a device used to store electrical energy. As used herein, the term battery will include both a singular device used to store electrical energy as well as multiple storage devices connected in an array or other configuration to provide additive storage capacity. The process of storing electrical energy or power into a battery is referred to as charging the battery. Conversely, the process of removing or using the stored electrical energy from a battery is referred to as discharging the battery. The total amount of energy that can be stored in a battery, i.e. a battery's total capacity, depends on the type, size, and condition of the battery. The amount of electrical energy stored in a battery is typically referred to as a battery's capacity (Q) and is measured in units of ampere-hours (AH). The unit ampere-hours is indicative of the inverse relationship between a battery's remaining capacity or reserve time and the current being supplied by the battery. Specifically, the greater the current being supplied by the battery, the faster the battery discharges, and thus, the shorter the time the battery can supply such current before completely discharging its stored capacity of electrical energy. Conversely, the smaller the current supplied, the slower the battery discharges, and the longer the battery can supply such current before becoming completely discharged.

As electrical devices and systems have become increasingly prevalent in consumer and industrial applications, there has been a corresponding increase in the use of batteries. The uses of batteries to supply electrical power are as varied as the electrical devices and systems in which they are used. Some electrical systems, such as portable electronic devices, use a battery as their primary source of electrical energy. Other electrical systems or devices receive their primary supple, of electrical power from a power source such as a generator, power plant, or line power supply. Even these devices often utilize a battery, however, as a back-up or secondary supply of electrical power. In such battery-backed systems, if the primary power source fails, the battery can be used to supply electrical power until the primary power supply is reinstated. This scheme of redundant power sources is often utilized in electrical devices or systems in which a temporary loss of power is problematic. Such systems include very complex as well as relatively simple applications. Examples include alarm clocks, where a loss of power could result in the clock losing track of the proper time thus resulting in a false or a late alarm; computers, where an untimely loss of power could result in lost data; and telecommunications systems, where a loss of power could result in a shutdown of communications networks.

Since a battery can only store a limited amount of electrical energy, once that energy has been exhausted the battery will no longer be able to supply electrical power to the electrical system or device. For any electrical device, then, knowing how much battery capacity remains is a convenient feature since a battery's remaining capacity determines the battery's reserve time, i.e., how much longer before the battery supply is exhausted and thus how much longer the electrical device or system may be used. In electrical systems which require an uninterrupted power supply, determining when the batterypower supply will be exhausted may not only be a convenient feature, but such capability may be a critical system design feature. In order to ensure an uninterrupted power supply, the remaining battery capacity or reserve time must be accurately predicted such that either the primary power supply can be restored to service, or another alternative power supply can be connected, before the battery power supply is exhausted.

It should be noted that the total amount of energy that can be stored in a battery, i.e. a battery's total capacity, is not constant. A battery's capacity depends not only on the type and size of the battery, but also on the condition of the battery (i.e., age of the battery and its operating environment during its life). For example, the life of a lead acid battery is greatly affected by the temperature of the environment. Moreover, all batteries slowly begin an aging process which results in a continuing decrease in a battery's available capacity and in other performance characteristics. This deterioration in a battery's performance is typically caused by an increase of internal resistance in the battery caused by water loss, grid corrosion/deterioration, bad cells, or other deleterious means. Often, harsh operating environments, such as environments with high temperatures, can accelerate the deterioration of battery performance over time. As a result of the battery's changing total capacity, the battery should be routinely monitored to determine its capacity or reserve time in order to ensure that the battery will have sufficient capacity to support the electrical system if and when necessary.

In systems that rely on batteries to supply electrical power, either as the primary or secondary power supply, battery performance is counted on and therefore must be reliable. In those electrical devices or systems in which a temporary loss of power is problematic ensuring proper battery performance can be a critical system design feature. In many systems that utilize a battery, the system is specifically designed with the capability to monitor the condition or health of the battery. Some systems incorporate a capacity indicator, or "fuel gauge," which shows the available battery capacity. By knowing the system's power requirements, this fuel gauge allows one to determine if the battery has sufficient capacity to support the system for a sufficient time before the primary power is reinstated. Moreover, such a fuel gauge can be useful during a battery discharge to determine how much battery capacity remains and thus how much reserve time the battery has left.

Certain methods and apparatus are available for determining the condition of a battery. Typically, these methods involve monitoring certain battery parameters during a battery discharge which are indicative of the battery's performance in order to determine the remaining capacity (Q) and reserve time (t) of the discharging battery. The initial method used for predicting remaining battery life is strictly empirical, wherein extensive testing of the battery is conducted in order to compile a large database of characteristics indicative of the battery's performance throughout the cycle of the battery from a fully charged state to a fully discharged state. By comparing these predetermined test characteristics to the battery's actual characteristics, as measured during use, one can predict what stage of discharge the battery is in and thus how much battery capacity or reserve time remains.

For this empirical method to yield accurate and reliable results, however, the initial testing has to account for a multitude of factors which could affect the battery's performance. This means the testing must be performed under conditions matching the actual use of the battery as closely as possible. Not only does this mean testing has to be performed for each type and size battery individually, but also the testing should include other external variables such as the load on the battery as well as the battery's temperature and environment (all factors which can affect the battery's performance characteristics). The result is that there are innumerable combinations of such factors which would have to be tested for each battery in order for the empirical data to be useful and accurate for all applications. Moreover, to have test data useful for reliably predicting a specific battery's performance essentially requires duplicating the application in which the battery is going to be used. This is obviously impractical to do for all possible applications. Typically, then, the testing has been standardized by performing the tests with standard loads and standard variables for the surrounding temperature/environment for each of the different types and sizes of batteries. The data from these standardized tests, however, provides limited accuracy and reliability for predicting the remaining battery capacity and reserve time.

In addition to the costly and extensive intial testing required for this empirical method, the apparatus or equipment needed to perform this method can also be costly. Specifically, due to the large database of information required for this method, any computer or other control system using this method would require a large amount of memory to store the relatively large database of predetermined test data used for comparison. The combination of these expenses, as well as the limited usefulness of standardized data with respect to each unique application, and the resulting inaccuracy and unreliability of the predictions based on such standardized data, has made this method largely impractical.

Other more theoretical methods have been suggested to address the inherent limitations of attempting to rely strictly on such empirical methods for predicting the remaining capacity and reserve time of a battery. The fundamental method of prediction, of the prior art, is based on the Peukert equation:

$$t = aI^b$$

where (t) is the reserve time to a given end voltage, (I) is the discharge current and (a) and (b) are empirically determined parameters. The remaining reserve time during discharge is obtained by subtracting the actual time of discharge from the value (t) given by the equation. The only real time data used in this approach is the discharge current (I), while the parameters (a) and (b) must again be experimentally predetermined by extensive testing, data acquisition, and parametric analysis. Since these parameters are empirically derived, the values of these parameters are fixed and do not adapt to changing conditions affecting battery performance such as changing load requirements, temperature, or aging of the battery.

An attempt to be more responsive to changes in battery behavior during discharge is disclosed U.S. Pat. No. 5,371,682 submitted by D. Levine et al., which utilizes matrices of predetermined parameters that correlate the slope of the voltage-versus-discharge time at various discharge currents, battery voltages during discharge, and end voltages. The use of voltage-versus-time slopes for prediction allows the method to be highly adaptable to changes in battery behavior during discharge. This method, however, also requires extensive initial testing to derive the data to populate the matrices.

Another approach disclosed by R. Biagetti and A. Pesco in U.S. Pat. No. 4,952,862, operates by measuring the difference between battery voltage during discharge and the battery plateau voltage, $$V_{battery} - V_P.$$

During discharge this difference is plotted against a ratio of discharged capacity to the total discharge capacity available:

$$Q_{removed}/Q_{to-end-voltage}.$$

This plot, created from measured data, is a single curve having an exponential and a linear region. The curve can then be used to determine remaining capacity and reserve time from the measured discharged capacity ($Q_{removed}$) and the plateau voltage ($V_p$). As in the above described method, extensive prior testing and data analysis of the particular battery being monitored is required, and the method does not account for aging of the battery since the plateau voltage ($V_p$) is a predetermined fixed value.

Another approach in determining the reserve time of a discharging battery, disclosed in U.S. Pat. No. 4,876,513, takes advantage of the fact that when battery voltages (corrected for internal resistance) are plotted versus a ratio of ampere-hours remaining to ampere-hours available to a certain discharge voltage, all discharge curves fall on a single curve. The battery voltages are calculated using a battery internal resistance that is measured periodically during discharge.

Although moderately effective, none of these preexisting methods for evaluating the state of a discharging battery works accurately at all temperatures, requires only a minimal number of empirically derived parameters, is independent of the battery size being monitored, and adapts to changing conditions affecting battery performance. In response to these deficiencies, Trung V. Nguyen developed a more accurate apparatus and method of predicting remaining battery capacity (Q) and reserve time (t) of a discharging battery to a selected end voltage. The method is disclosed in U.S. Pat. No. 5,631,540 and is primarily based on measurable battery parameters which do not require extensive pre-testing of the battery. The battery reserve time (t) of a discharging battery is determined by an arrangement considering the discharge current (I), battery voltage (V), battery temperature (T), and the battery's internal resistance ($R_{int}$). The remaining battery capacity (Q) is determined from the ratio between a maxirnum theoretical capacity ($Q_{max}$) and its present capacity (Q). A term defined by a sum of the battery fully charged open circuit voltage ($E_{oc}$) and the voltage loss due to the internal resistance of the battery ($IR_{int}$) and the battery voltage on discharge (V) divided by the battery temperature (T), is computed as the temperature-corrected battery overvoltage ($\eta$):

$$\eta = \frac{Eoc - IRint - V}{T}.$$

The characteristics of the battery discharge are reduced to a ratio of the remaining battery canity to maximum theoretical capacity:

$$\frac{Q}{Q_{max}}.$$

This normalized battery capacity value is plotted versus the temperature-corrected battery overvoltage to produce a discharge characteristic curve that is invariant to discharge rates, temperatures, and battery size. This normalized battery capacity is determined by fitting parameters to the overvoltage value η by the relation:

$$\frac{Q}{Q_{max}} = \text{EXP}^{(a+b\eta^c+d\eta^c)}.$$

to characterize the discharge characteristic and determine Q. A reserve time (t) can then be calculated from the determined capacity value (Q) using the relation:

$$t = \frac{Q}{I}.$$

The characteristic curve and the dynamic variables can be stored in a computer and processed continuously to provide a continuing real time prediction of the remaining capacity (Q) and reserve time (t) of the battery on discharge.

Nguyen's method, however, also has some shortcomings. The method requires limited testing to generate several battery parameters, and is thus specific to the battery type. In addition, the method is not completely invariant to all external factors impacting battery performance, such as aging, deterioration, and defects in the battery or battery connections. Accordingly, the calculation process disclosed by Nguyen produces results which, although relatively accurate as compared to previous prediction methods, are not always within an acceptable tolerance, especially when the battery exhibits changing performance characteristics over time.

Of particular significance is that Nguyen's method does not account for aging of the battery. In real applications,, however, all batteries slowly begin an irreversible aging process which results in a corresponding decrease in a battery's available capacity. This drop in capacity is partly due to the increase of internal resistance caused by water loss, grid corrosion/deterioration, temperature, or other means. Since Nguyen's method does not account for these changes, predictions based on Nguyen's method can lose accuracy as the battery ages.

In sum, these methods are all either relatively inaccurate, require extensive testing of the battery to predetermine battery characteristics, require sophisticated testing apparatus to gather the necessary predetermined data, or require complex and expensive hardware and software to perform the necessary calculations during real-time battery discharges.

SUMMARY OF THE INVENTION

To this end, in accordance with the present invention, there is provided a simplified method for monitoring the status of a battery and, more specifically, for predicting battery reserve time. The method of the present invention monitors a battery's performance during discharge and compares the normalized battery voltage measured during the discharge to a universal normalized discharge curve. By determining where the measured normalized battery voltage falls on the universal normalized discharge curve, the battery's remaining capacity or reserve time (t) can be calculated.

The method of the present invention is superior in that it is simpler and less costly to implement and yet still provides relatively accurate results. In particular, the method does not require extensive testing of the battery to predetermine battery parameters or data. The inventive method does not require sophisticated hardware or software capability in the system to perform the necessary calculations in real-time. The method requires no monitoring of the battery status; i.e., age, condition, rate of discharge, etc. And finally, since the universal normalized discharge curve is the same for all similar types of batteries (i.e., valve-regulated lead acid batteries, flooded lead acid batteries, etc.) irrespective of changes in battery models, battery temperature, age of the battery, and discharge rates, the method requires no modification to use in different systems utilizing various types of batteries.

The inventive method of monitoring the status of a battery, comprises the steps of: predetermining the desired percent of battery discharge of the total available capacity for the battery; determining the normalized battery voltage level corresponding to the desired percent of battery discharge using a universal normalized discharge curve; initiating a battery discharge; monitoring the battery voltage and time throughout the discharge; identifying the peak voltage ($V_p$) of the battery discharge; determining a measured normalized battery voltage by normalizing the battery voltage with the peak voltage ($V_p$); terminating the test when the measured normalized battery voltage reaches the predetermined normalized battery voltage level; and determining the reserve time of the battery from the amount of time expended during the discharge.

An alternate embodiment of the inventive method of monitoring the status of a battery, comprises the steps of: predetermining the desired percent of battery discharge of the total available capacity for the battery; determining the normalized battery voltage level corresponding to the desired percent of battery discharge using a universal normalized discharge curve; initiating a battery discharge; monitoring the battery voltage and time throughout the discharge; identifying the foothill voltage ($V_{fh}$) of the battery discharge; determining a measured normalized battery voltage by normalizing the battery voltage with the foothill voltage ($V_{fh}$); terminating the test when the measured normalized battery voltage reaches the predetermined normalized battery voltage level; and determining the reserve time of the battery from the amount of time expended during the discharge.

DETAILED DESCRIPTION OF THE DRAWINGS

Figure 1:
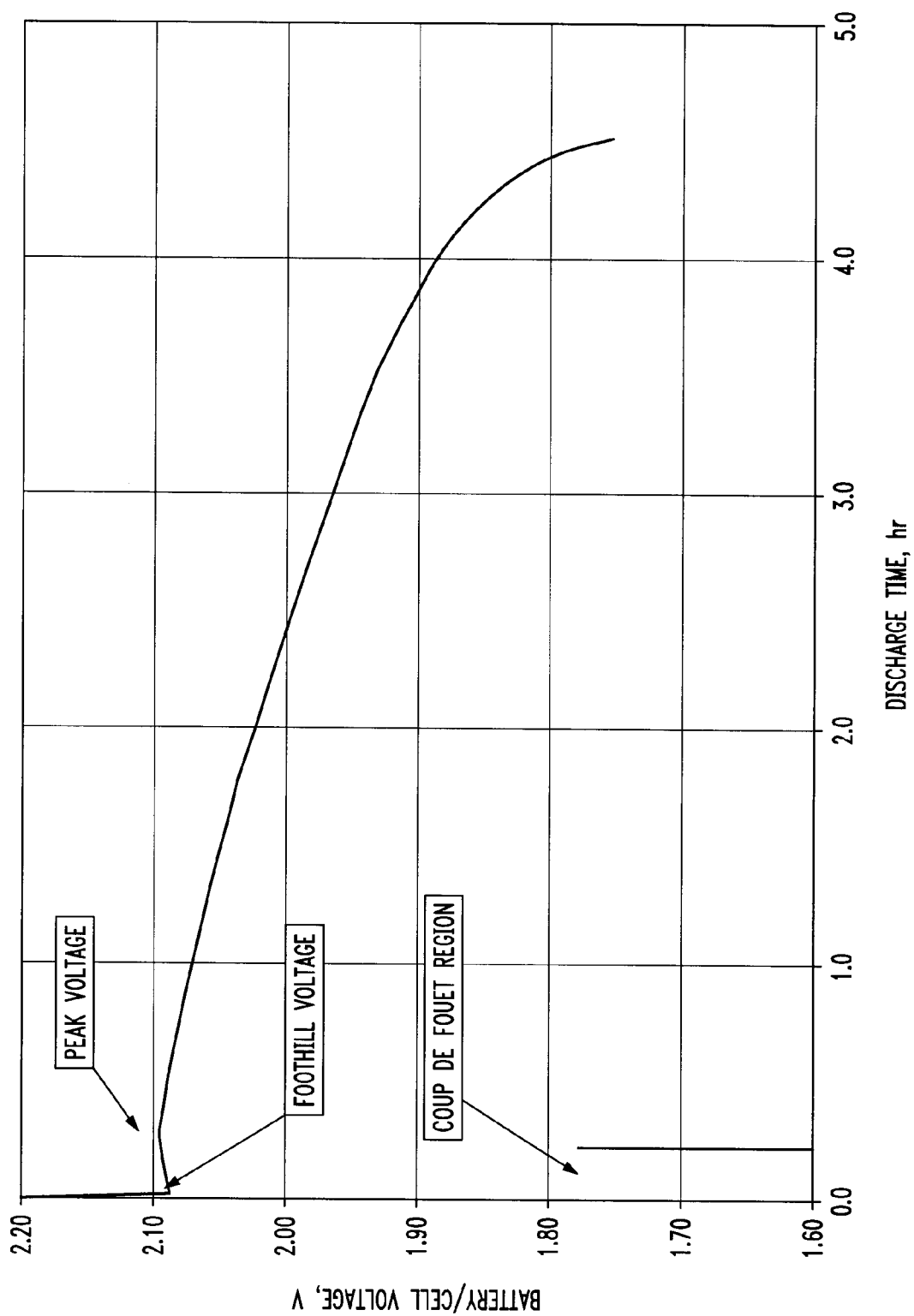
FIG. 1 is a graph of a typical battery discharge curve for a lead acid battery in terms of battery voltage versus discharge time.

In FIG. 1, a typical discharge curve is plotted for a lead acid battery in terms of battery voltage (V) versus discharge time (t), in hours. The discharge curve is based on actual measured data. As shown in FIG. 1, the battery voltage initially drops very rapidly at the start of a discharge. After this initial drop, the battery voltage recovers and then begins to gradually decrease as the battery is further discharged and the battery capacity begins to diminish. The rapid initial drop in battery voltage is largely due to electrochemical phenomenon occurring within the battery. The minimum voltage of the initial drop is called the foothill voltage ($V_{fh}$). After the foothill voltage ($V_{fh}$) is reached, the battery voltage recovers to a higher voltage. The maximum recovery voltage after the initial drop in battery voltage is called the peak voltage ($V_p$). This initial region of the discharge curve, from the start of the discharge to the peak voltage ($V_p$), is called the Coup de Fouet region. After the Coup de Fouet region, the battery voltage gradually drops as the active materials for the electrochemical reactions in the battery, i.e., acid and lead oxide for lead acid batteries, are depleted. Eventually, the mass transfer limitation of the battery's reactants is reached and the voltage drops precipitously to the predetermined end voltage.

Figure 2:
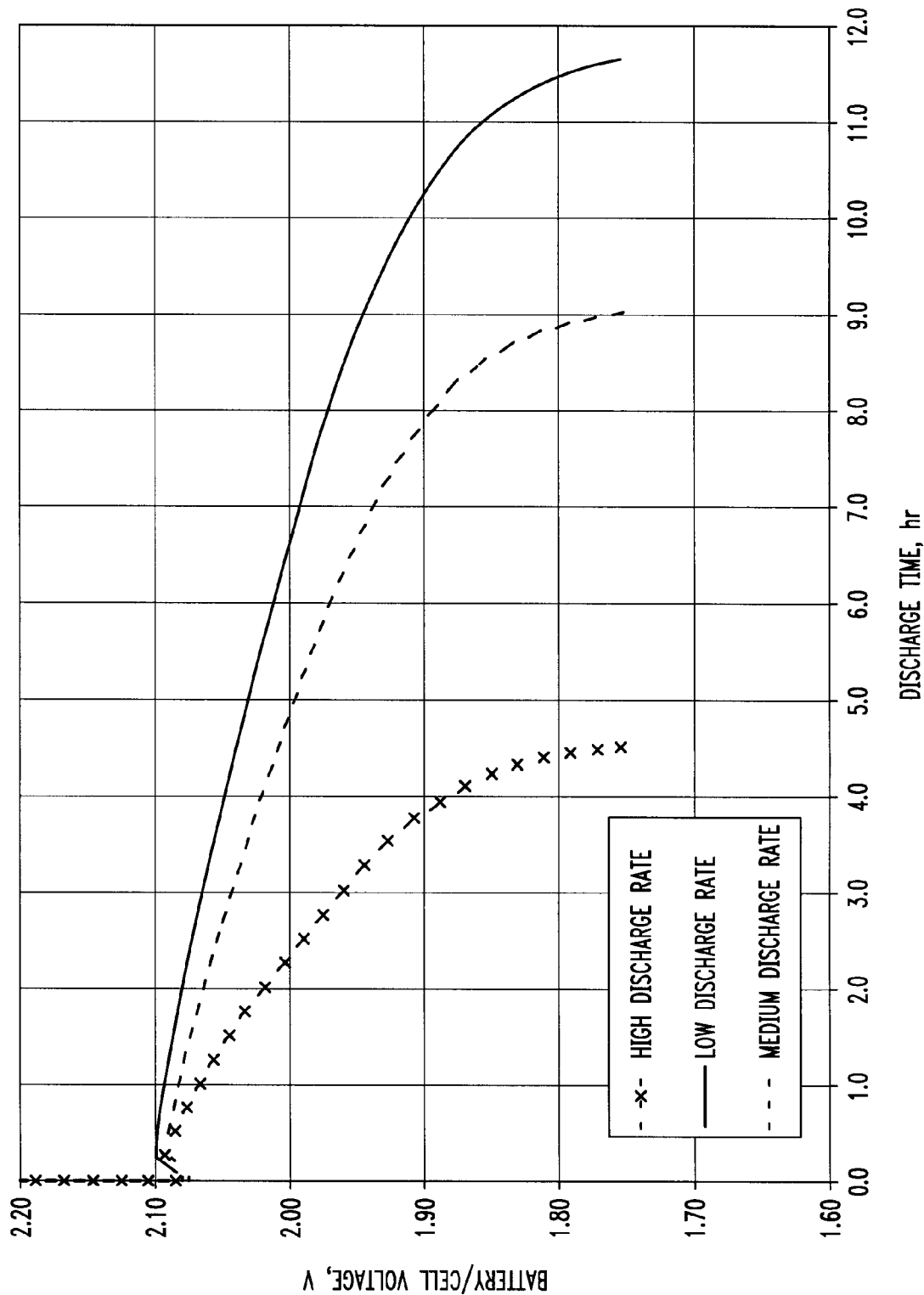
FIG. 2 is a graph of discharge curves of a battery at three different discharge rates.

In FIG. 2, a graph of actual discharge curves of a battery at three different discharge rates is plotted. More particularly, FIG. 2 illustrates the discharge curves associated with the same battery discharging its stored electrical energy at three different rates of discharge. As previously discussed, the higher the discharge current, the faster the battery discharges its stored capacity, and thus, the higher the discharge rate. It should be noted from FIG. 2 that at all three discharge rates the battery still exhibits the Coup de Fouet region, with a foothill voltage ($V_{fh}$) and peak voltage ($V_p$). Although the Coup de Fouet region is a typical discharge characteristic of certain types of batteries, such as lead acid batteries, the region may not occur in some extreme discharge conditions, such as extreme high and low discharge rates. The exact cause of the Coup de Fouet region is not well known and thus its disappearance in extreme discharge conditions is not completely understood. However, under normal operation conditions, i.e., at normal discharge rates, the Coup de Fouet region is typically observed. The Coup de Fouet region is important to the method of the current invention since the method utilizes the peak voltage ($V_p$) or foothill voltage ($V_{fh}$) measured in this region of the discharge curve.

Figure 3:
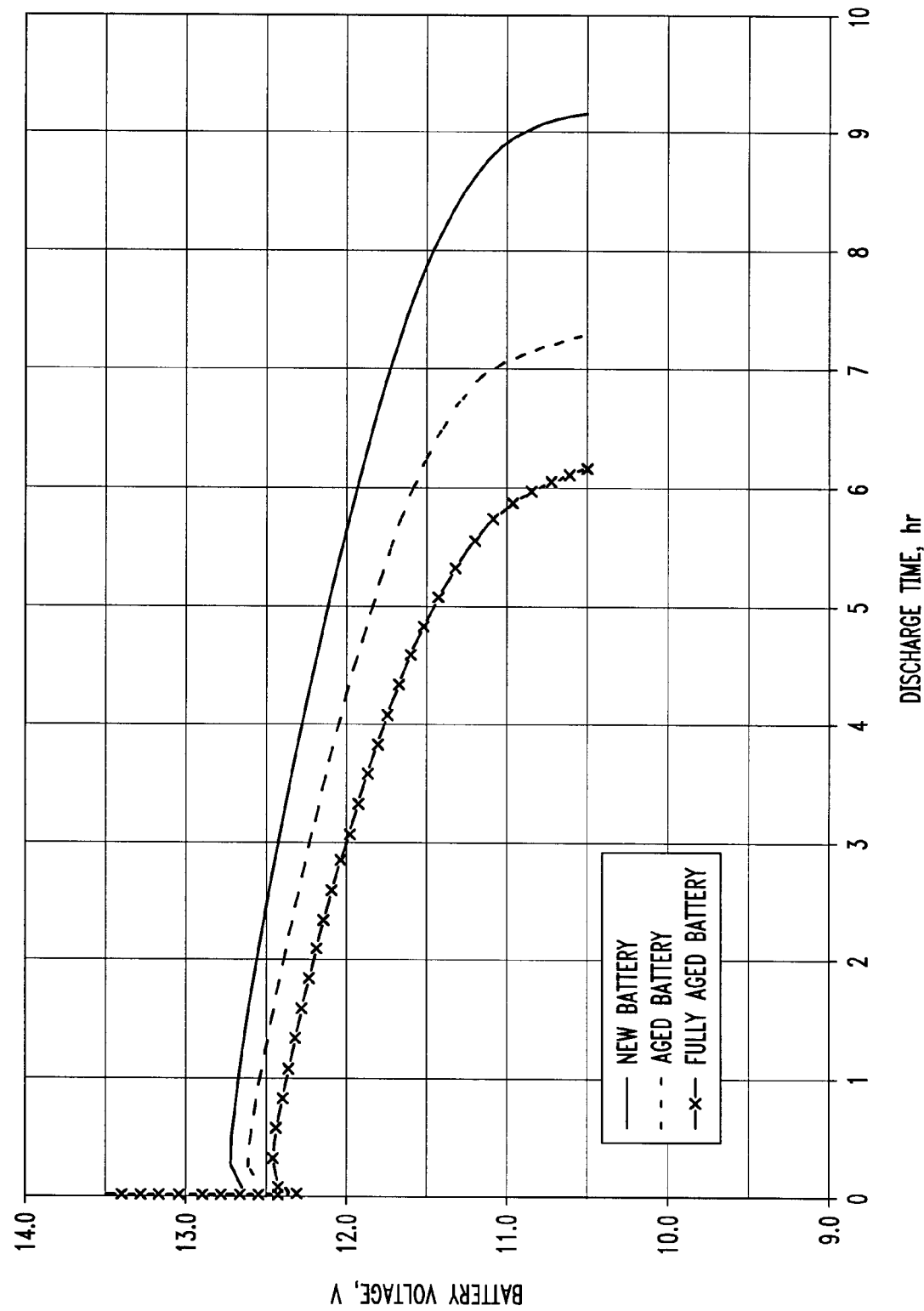
FIG. 3 is a graph of discharge curves of a battery at three different aged states.

FIG. 3 is a graph of actual discharge curves of a battery at three different aged states. As previously discussed, as a battery ages its capacity and performance typically deteriorates. FIG. 3 illustrates the deteriorating performance of the same battery after it has been aged in a temperature chamber. The discharge curves showvn in FIG. 3 are all from the same battery at the same discharge rate and temperature. However, the aging effect is clear given the deteriorating performance and capacity of the battery. Again, it should be noted that despite the deterioration in battery performance caused by aging, the battery continues to exhibit the Coup de Fouet region, with the necessary foothill voltage ($V_{fh}$) and peak voltage ($V_p$) for the method of the current invention.

Figure 4A:
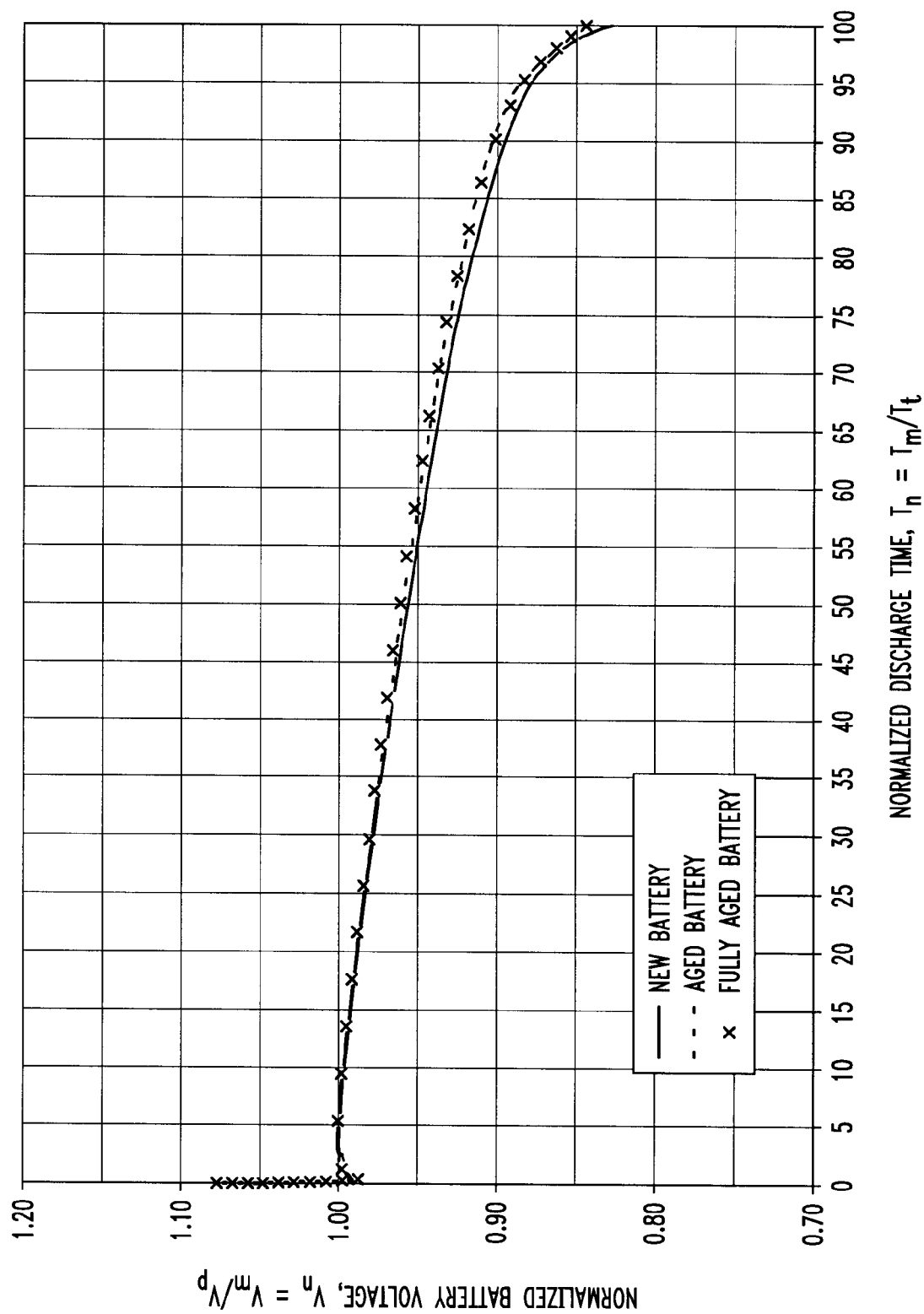
FIG. 4a is a graph of the unified discharge curve for the curves shown in FIG. 3 after the curves have been normalized with the peak voltage ($V_p$) and the total discharge time ($T_t$).

FIG. 4a is a graph of the unified discharge curve for the curves showvn in FIG. 3 after the curves have been normalized with the peak voltage ($V_p$) and the total discharge time ($T_t$). More particularly, FIG. 4a shows that the discharge curves of FIG. 3 converge to a single unified discharge curve when each of the curves is normalized with the peak voltage ($V_p$) and the total discharge time ($T_t$). To normalize a discharge curve with the peak voltage ($V_p$), the normalized battery voltage ($V_n$) is calculated as the battery voltage measured ($V_m$) divided by the peak voltage ($V_p$):

$$(V_n)=(V_m)/(V_p)$$

and the normalized discharge time ($T_n$) equals the time measured ($T_m$) divided by the overall total discharge time ($T_t$):

$$(T_n)=(T_m)/(T_t).$$

Remarkably, although the curves of FIG. 3 represent three different discharge curves for a battery suffering deterioration from aging effects, the curves all converge to a single unified discharge curve when normalized using the peak voltage ($V_p$) and the total discharge time ($T_t$). Accordingly, normalization to a unified discharge curve may be an effective model for battery performance independent of aging effects on the battery.

Figure 4B:
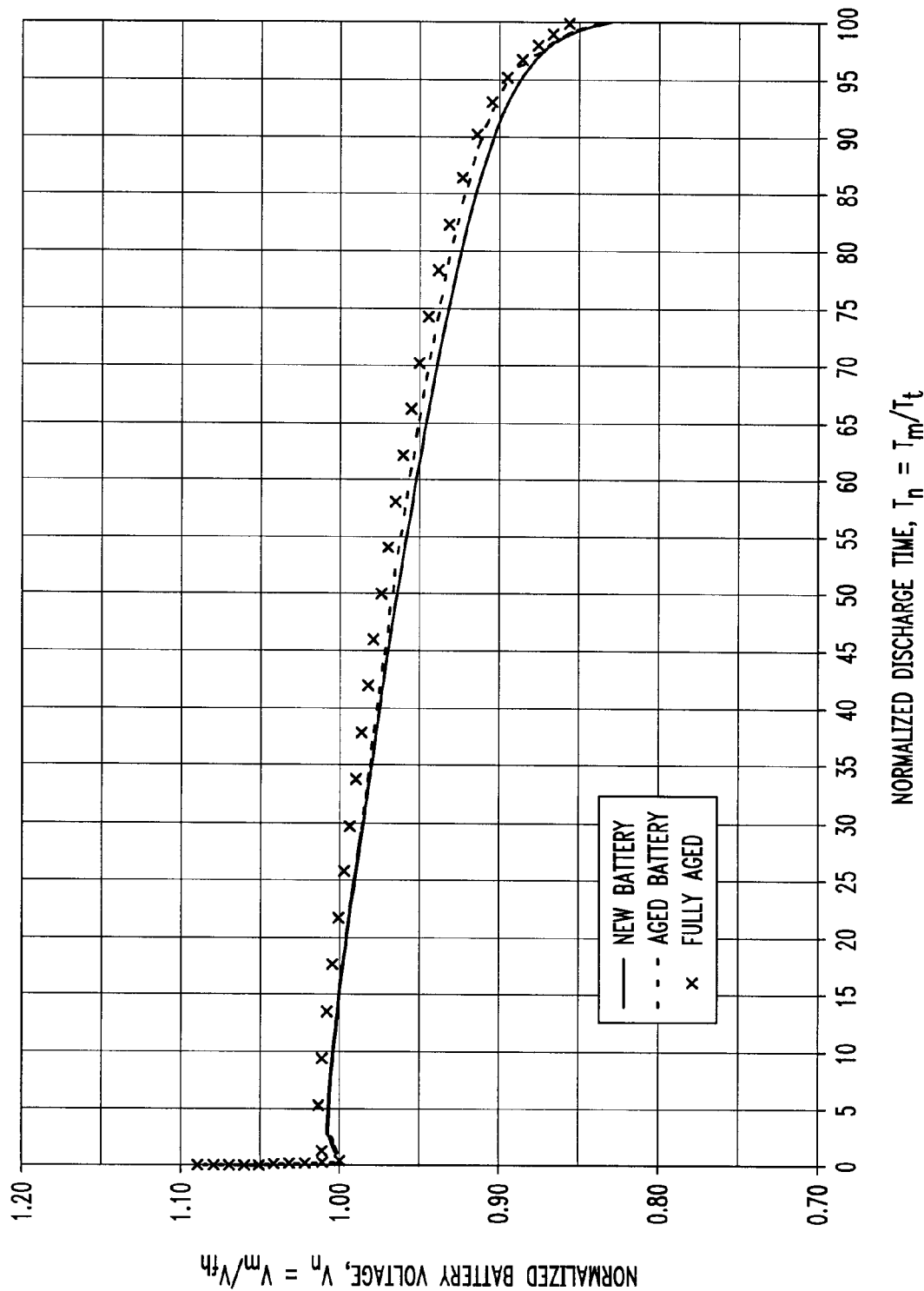
FIG. 4b is a graph of the unified discharge curve for the curves shown in FIG. 3 after the curves have been normalized with the foothill voltage ($V_{fh}$) and the total discharge time ($T_t$).

FIG. 4b is a graph of the unified discharge curve for the curves shown in FIG. 3 afer the curves have been normalized with the foothill voltage ($V_{fh}$) and the total discharge time ($T_t$). More particularly, similar to FIG. 4a, FIG. 4b shows that the discharge curves of FIG. 3 also converge to a single unified discharge curve when each of the curves is normalized with the foothill voltage ($V_{fh}$) and the total discharge time ($T_t$). To normalize a discharge curve with the foothill voltage ($V_{fh}$), the normalized battery voltage ($V_n$) is calculated as the battery voltage measured ($V_m$) divided by the foothill voltage ($V_{fh}$):

$$(V_n)=(V_m)/(V_{fh})$$

and, as before, the normalized discharge time ($T_n$) equals the time measured ($T_m$) divided by the total discharge time ($T_t$):

$$(T_n)=(T_m)/(T_t).$$

Again, although the curves of FIG. 3 represent three different discharge curves for a battery suffering deterioration from aging effects, the curves all converge to a single unified discharge curve when normalized using the foothill voltage ($V_{fh}$) and the total discharge time ($T_t$). It should be noted, however, that the convergence of the curves is better when the discharge curves are normalized with the peak voltage ($V_p$) as opposed to the foothill voltage ($V_{fh}$). Thus, although normalization to a unified discharge curve via the foothill voltage ($V_{fh}$) may also be an effective model for battery performance independent of aging effects, normalization to a unified discharge curve via the peak voltage ($V_p$) may be more accurate.

Figure 5:
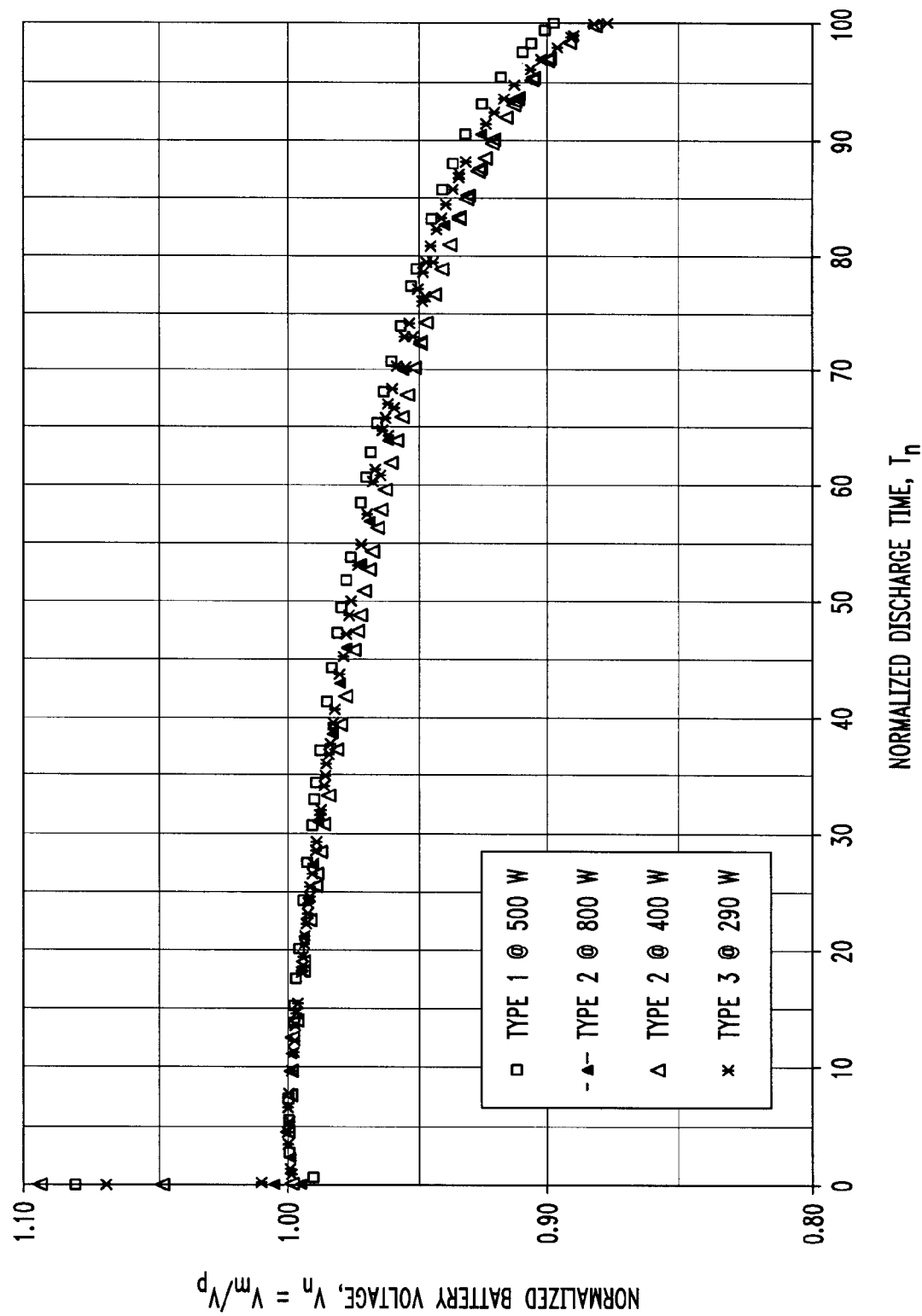
FIG. 5 is a unified discharge curve for three different new flooded batteries discharging at different rates where each battery's discharge curve has been normalized with the peak voltage ($V_p$) and the total discharge time ($T_t$).

FIG. 5 is a unified discharge curve for three different new flooded batteries at different discharge rates, i.e., different discharge currents, where each battery's discharge curve has been normalized with the peak voltage ($V_p$) and the total discharge time ($T_t$). More particularly, FIG. 5 illustrates that the discharge curves of three different models of flooded type lead acid batteries, supplied by different vendors, discharging at different rates, all seem to converge to a single unified discharge curve when each battery's discharge curve is normalized with its peak voltage ($V_p$) and the total discharge time ($T_t$). Accordingly, for flooded lead acid batteries, normalization to a unified discharge curve may be an effective model for battery performance independent of the particular battery model and independent of the discharge rate.

It should be noted that the testing performed to date indicates that the curves demonstrate better convergence for the first 20–30% of the total discharge time. This behavior can be accounted for in a battery discharge test wherein the test is terminated after 20–30% of the total discharge time has elapsed, thereby providing more accurate prediction results than if the test were allowed to proceed longer. The convergence throughout the total discharge time is sufficient, however, to provide relatively accurate prediction results. Thus, the discharge test can be performed for any portion of the total discharge time.

Figure 6:
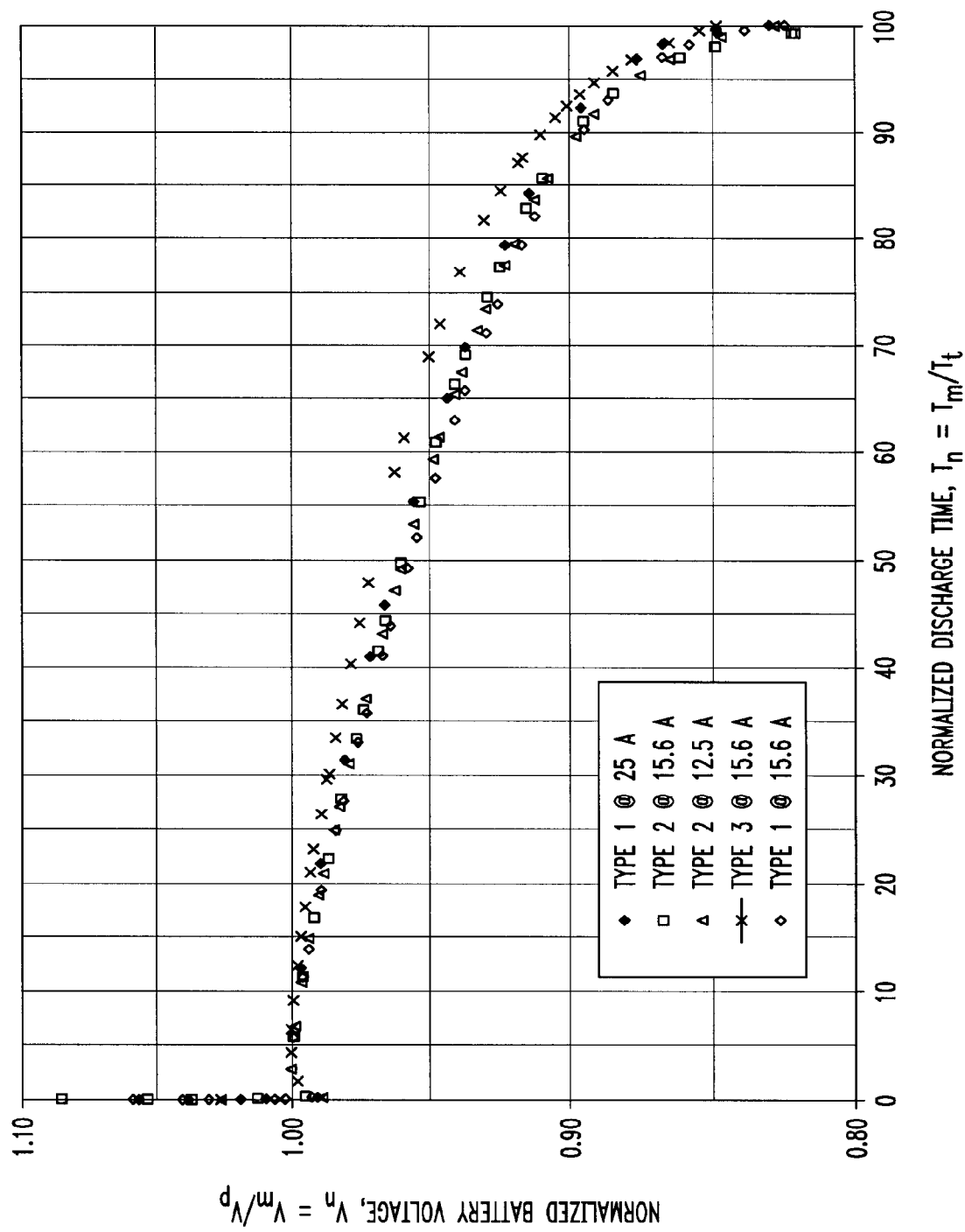
FIG. 6 is a unified discharge curve for three different new valve-regulated lead acid batteries discharging at different rates where each battery's discharge curve has been normalized with the peak voltage ($V_p$) and the total discharge time ($T_t$).

FIG. 6 is a unified discharge curve for three different new valve-regulated lead acid batteries discharging at different rates, i.e., different discharge currents, where each battery's discharge curve has been normalized with the peak voltage ($V_p$) and the total discharge time ($T_t$). More particularly, similar to FIG. 5, FIG. 6 illustrates that the discharge curves of three different models of valve regulated lead acid batteries also seem to converge to a single unified discharge curve when each battery's discharge curve is normalized with its peak voltage ($V_p$) and the total discharge time ($T_t$). Accordingly, for valve-regulated lead acid batteries, normalization to a unified discharge curve may also be an effective model for battery performance independent of the particular battery model and independent of the discharge rate.

Figure 7:
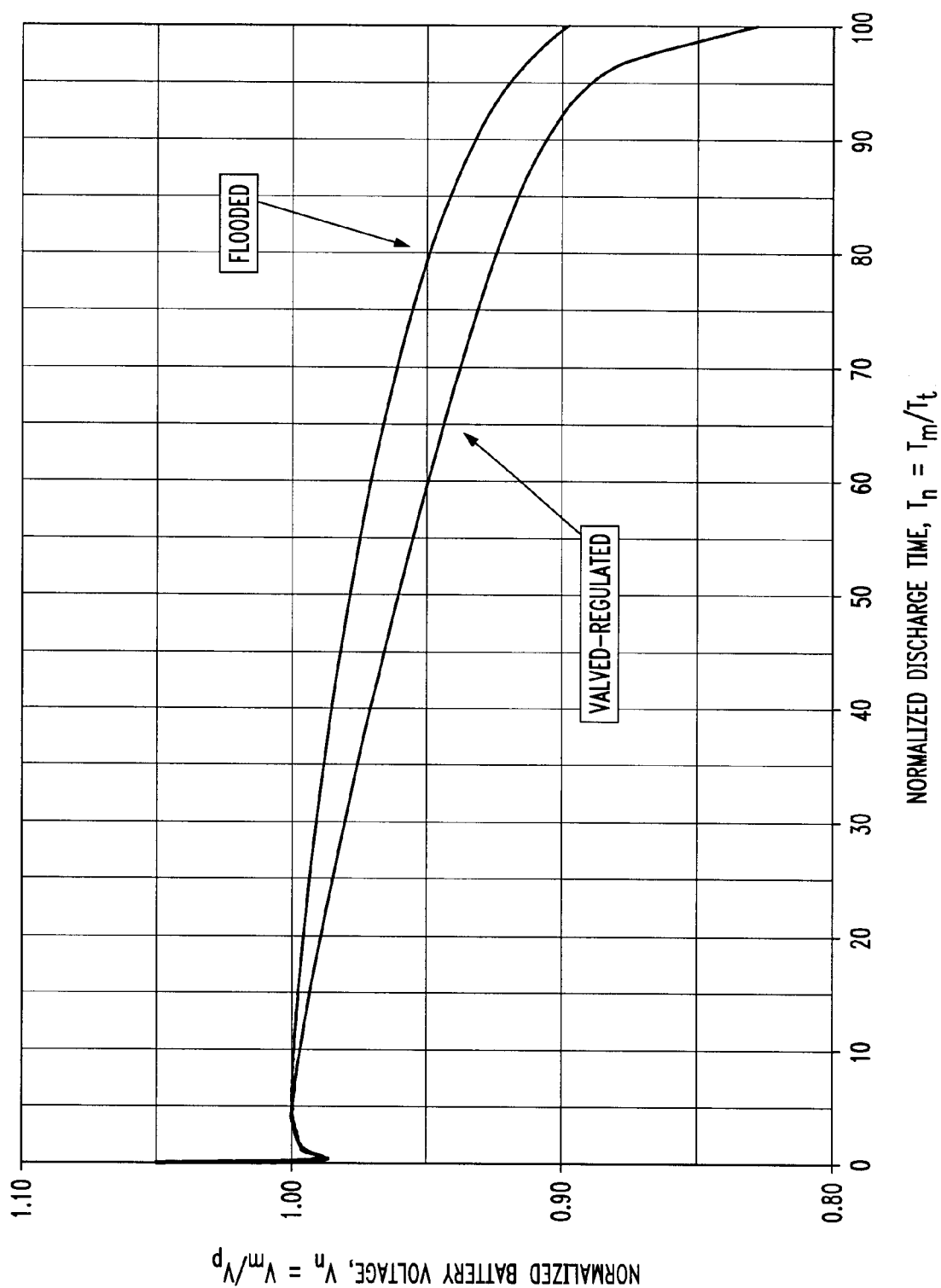
FIG. 7 is a graph of universal discharge curves for valve-regulated and flooded lead acid batteries.

FIG. 7 shows universal normalized discharge curves for flooded and valve-regulated lead acid batteries. As shown, the two types of lead acid batteries exhibit slightly different normalized discharge curves. This suggests that normalization to a unified discharge curve may be dependent on the type of battery. The differences in the unified discharge curves of different types of batteries can be taken into account in any battery test scheme by utilizing different universal normalized discharge curves depending on the type of lead acid battery to be tested.

Figure 8:
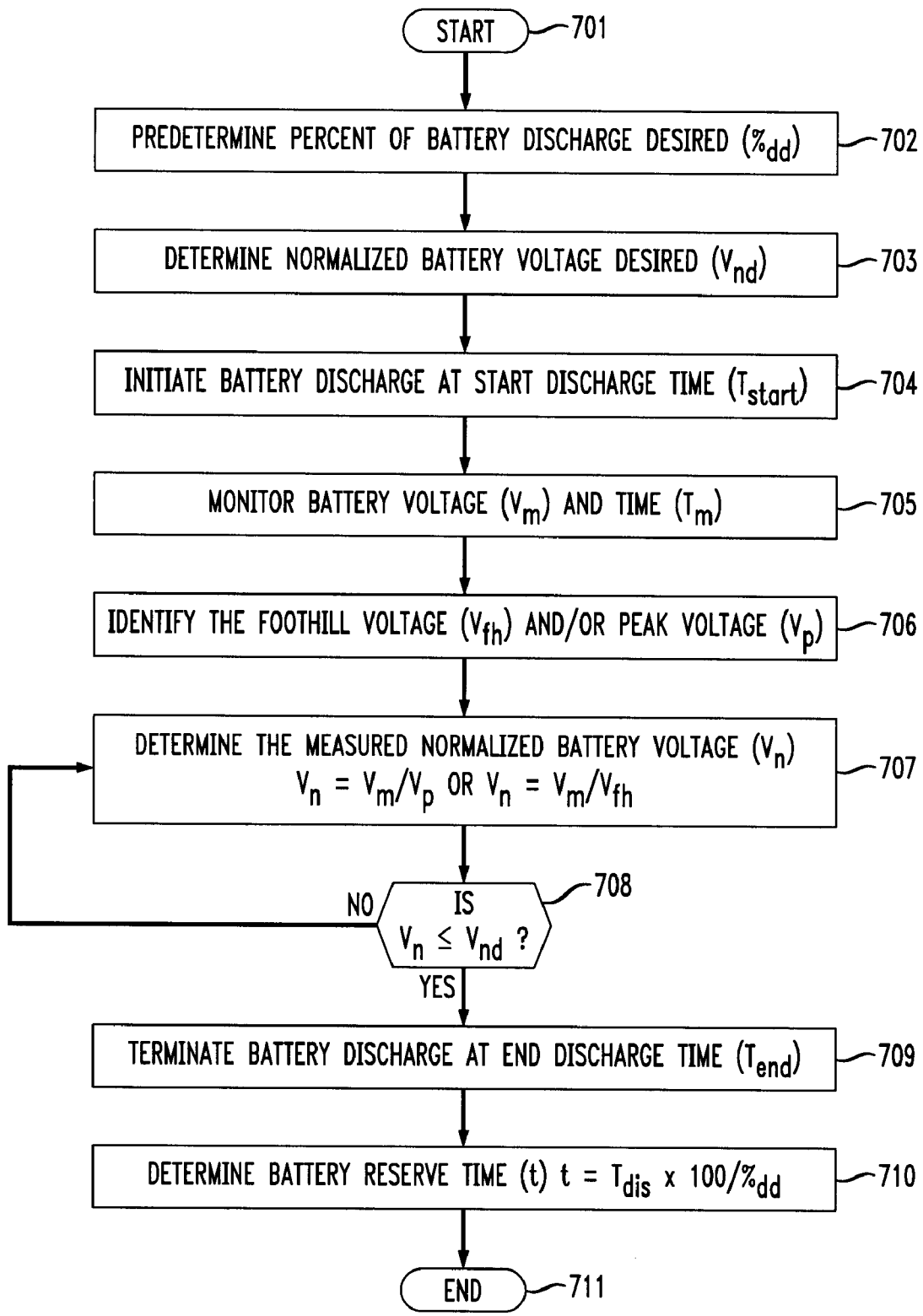
FIG. 8 is a flow diagram illustrating an embodiment of the method of the present invention wherein a battery's remaining capacity or reserve time is determined by comparing normalized battery voltage and time measurements monitored during a battery discharge to a universal normalized discharge curve.

Because the universal normalized discharge curve is independent of battery model, discharge rate, and battery age, the curve is suitable for monitoring battery performance and health using a simple discharge test. FIG. 8 provides a flow diagram illustrating an embodiment of the method of the present invention for using the universal normalized discharge curve to monitor the health and condition of a battery in an electrical system. More particularly, FIG. 8 shows the process or method for determining a battery's reserve time by comparing normalized battery voltage and time measurements monitored during a battery discharge to a universal normalized discharge curve. The inventive process starts at terminal 701 and proceeds to block 702 whose instructions require predetermining a percent of battery discharge desired ($\%_{dd}$). This percentage ($\%_{dd}$) represents the percent of the total available capacity of the battery sought to be discharged in the discharge test. Essentially, the percent discharge desired ($\%_{dd}$) establishes the desired end point for the discharge test. This percent can be entered by a user, via a user access interface such as a keyboard, etc., or can be input from software or set in system memory. As noted in block 703, once the desired percent of discharge ($\%_{dd}$) is known or predetermined, the normalized battery voltage level associated with that percent discharge ($V_{nd}$) is determined from the universal normalized discharge curve for the battery. Universal normalized discharge curves for flooded and valve-regulated lead acid batteries are shown in FIG. 7. Specifically, the percent of discharge desired ($\%_{dd}$) indicates what percent of the total discharge time is to be expended in the test. As shown in FIG. 7, since the universal normalized discharge curve is normalized to the total discharge time ($T_t$), the units on the X-axis of the graph are comparable to percentages of total discharge time. Thus, 100 percent would equate to a total discharge or 100 on the X-axis. Similarly, 20 on the X-axis would equate to a 20 percent discharge. Accordingly, universal normalized discharge curves comprise data indicative of a correlation between percent of battery discharge time versus normalized battery voltage. By finding the data point on the universal normalized discharge curve corresponding to the desired percent of battery discharge ($\%_{dd}$), via the X-axis, the normalized battery voltage associated with that data point can be read from the Y-axis of the graph. Thus, the universal normalized discharge curve, and the data incorporated therein, allows one to find the normalized battery voltage associated with any desired percent of battery discharge ($\%_{dd}$) Setting the desired normalized voltage ($V_{nd}$) to the normalized battery voltage associated with the desired percent of battery discharge ($\%_{dd}$) establishes the voltage level for the desired end point of the battery test.

With the desired end point for the test determined, that is, the desired normalized voltage ($V_{nd}$), Block 704 instructs that a battery discharge is initiated at start discharge time ($T_{start}$), The discharge is initiated by placing a load on the battery. In an electrical system utilizing the battery as a secondary or back-up power supply, the discharge may initiate in due course or a discharge, can be initiated by removing or terminating the primary supply of power thereby forcing the battery to supply electrical power to the load. As indicated in block 705, the battery voltage ($V_m$) and discharge time ($T_m$) are measured or monitored throughout the battery discharge. By successively comparing the chronologically consecutive battery voltages measured ($V_m$, $V_{m-1}$, $V_{m-2}$ ... $V_{m-t}$), the peak voltage ($V_p$) and foothill voltage ($V_{fh}$) can be determined for the battery discharge, as noted in block 706. As shown in FIG. 1, the foothill voltage ($V_{fh}$) is the lowest voltage measured during the Coup de Fouet region of the discharge curve. Conversely, the peak voltage ($V_p$) is the highest voltage measured during the Coup de Fouet region. Accordingly, the peak voltage ($V_p$) would be determined by setting the peak voltage ($V_p$) to the first battery voltage measured ($V_m$). Then, each successive battery voltage measured ($V_{m+t}$) is compared to the value of the peak voltage ($V_p$). If the battery voltage measured ($V_m$) is greater than the peak voltage ($V_p$), then the peak voltage ($V_p$) is reset to the new, higher value of the battery voltage measured ($V_m$). This comparison is made until either a certain time duration has elapsed or a certain number of iterations have been made without updating the value of the peak voltage ($V_p$). The time duration or number of iterations is set to ensure that the discharge has passed the Coup de Fouet region and thus the peak voltage ($V_p$) has been achieved and stored. The foothill voltage ($V_{fh}$) can be similarly determined except that the value of the foothill voltage ($V_{fh}$) is reset when the value of the voltage measured ($V_m$) is less than the foothill voltage ($V_{fh}$).

Using these either the peak voltage ($V_p$) or the foothill voltage ($V_{fh}$), the measured battery voltage ($V_m$) can be normalized. As indicated in block 707 the normalized measured battery voltage ($V_n$) equals the measured battery voltage ($V_m$) divided by either the peak voltage ($V_p$) or foothill voltage ($V_{fh}$). Although either the peak voltage ($V_p$) or foothill voltage ($V_{fh}$) can be used to normalize, as previously noted, normalizing with the peak voltage ($V_p$) may generally lead to more accurate test results.

The normalized measured battery voltage ($V_n$) is then compared to the desired normalized voltage ($V_{nd}$). As indicated in block 708, if the normalized measured battery voltage ($V_n$) is less than or equal to the desired normalized voltage ($V_{nd}$), then the discharge is terminated as per block 709. If the normalized measured battery voltage ($V_n$) is greater than the desired normalized voltage ($V_{nd}$), however, then the desired percent of discharge has not been reached and the discharge should not be completed. Accordingly, the process continues, repeating block 707 and 708, until the desired percent of discharge has been reached; that is, until the normalized measured battery voltage ($V_n$) is less than or equal to the desired normalized voltage ($V_{nd}$).

Once the discharge has been terminated pursuant to block 709 at end discharge time ($T_{end}$), the battery reserve time (t) is determined using the total amount of time expended during the discharge ($T_{dis}$). As indicated in block 710, the battery reserve time (t) equals the discharge time ($T_{dis}$) multiplied by the ratio of 100 divided by the percent discharge desired ($\%_{dd}$). So, if a 20% discharge was desired and selected at the beginning of the battery discharge test, the battery reserve time (t) would equal 5 times (i.e., 100/20) the end discharge time ($T_{end}$).

The resulting battery reserve time (t) can be output to a user access interface such as a video screen or printout to notify the user of the battery condition. Alternatively, the battery reserve time (t) can be stored and made available to other battery diagnostic programs or processes. Once the battery reserve time has been determined, the process ends as per block 711.

While the invention has been particularly shown and described with respect to specific embodiments thereof, it is to be understood that various changes in form and detail may be made hereto without departing from the spirit and scope of the present invention and shall be encompassed within the scope of the appended claims.

What is claimed is:

1. A method of monitoring the status of a battery producing a voltage, comprising:
   a) predetermining a normalized battery voltage discharge level ($V_{nd}$) corresponding to a desired percent of battery discharge ($\%_{dd}$) using a universal normalized discharge curve;
   b) initiating a battery discharge at a start discharge time ($T_{start}$);
   c) monitoring the voltage of the battery voltage measured ($V_m$) at a time measured ($T_m$) throughout the discharge;
   d) identifying a peak voltage ($V_p$) of the battery discharge;
   e) determining a measured normalized battery voltage ($V_n$) by normalizing the battery voltage measured with the peak voltage ($V_p$) by dividing the battery voltage measured ($V_m$) by the peak voltage ($V_p$); and
   f) terminating the battery discharge when the measured normalized battery voltage ($V_n$) reaches the predetermined normalized battery voltage discharge level ($V_{nd}$) at an end discharge time ($T_{end}$).

2. The method as described in claim 1, further comprising:
   g) determining a reserve time (t) of the battery from a total amount of time expended during a discharge ($T_{dis}$).

3. The method as described in claim 2, wherein determining the reserve time (t) of the battery from the total amount of time expended during the discharge ($T_{dis}$) comprises:
   i) determining the time expended during the discharge ($T_{dis}$) as the difference between the end discharge time ($T_{end}$) and the start discharge time ($T_{start}$) as in the following relation:

$$T_{dis} = T_{end} - T_{start};$$

and
   ii) determining the reserve time (t) of the battery calculated from the total time expended during the discharge ($T_{dis}$) multiplied by a ratio of 100 divided by the percent discharge desired ($\%_{dd}$) as in the following relation:

$$t = T_{dis}(100/\%_{dd}).$$

4. The method as described in claim 1, wherein determining the normalized battery voltage discharge level ($V_{nd}$) corresponding to a desired percent of battery discharge ($\%_{dd}$) using a universal normalized discharge curve comprises:
   i) providing a universal normalized discharge curve comprising data indicative of a correlation between a percent of battery discharge time versus a normalized battery voltage;
   ii) finding a data point on the universal normalized discharge curve corresponding to the desired percent of battery discharge ($\%_{dd}$);
   iii) setting the normalized battery voltage discharge level ($V_{nd}$) equal to the normalized battery voltage associated with said data point.

5. The method as described in claim 1, wherein initiating a battery discharge at the start discharge time ($T_{start}$) comprises:
   placing a load on the battery at the start discharge time ($T_{start}$).

6. The method as described in claim 1, wherein initiating a battery discharge at a start discharge time ($T_{start}$) comprises:
   removing a primary supply of power to a load in a battery-backed electrical system at the start discharge time ($T_{start}$).

7. The method as described in claim 1, wherein identifying the peak voltage ($V_p$) of the battery discharge comprises:
   i) setting the value of the peak voltage ($V_p$) to the battery voltage measured ($V_m$);
   ii) comparing each consecutive battery voltage measured ($V_m$) with the peak voltage ($V_p$);
   iii) resetting the value of the peak voltage ($V_p$) to the value of a battery voltage measured ($V_m$) when a battery voltage measured ($V_m$) is greater than the peak voltage ($V_p$).

8. The method as described in claim 1, wherein terminating the battery discharge when the measured normalized battery voltage ($V_n$) reaches the predetermined normalized battery voltage discharge level ($V_{nd}$) at the end discharge time ($T_{end}$) comprises:
   i) comparing the measured normalized battery voltage ($V_n$) to the predetermined normalized battery voltage discharge level ($V_{nd}$); and ii) terminating the battery discharge when the measured normalized battery voltage ($V_n$) is less than or equal to the predetermined normalized battery voltage discharge level ($V_{nd}$), at the end discharge time ($T_{end}$).

9. The method as described in claim 1, wherein terminating the battery discharge when the measured normalized battery voltage ($V_n$) reaches the predetermined normalized battery voltage discharge level ($V_{nd}$) at the end discharge time ($T_{end}$) comprises:

removing a load from the battery when the measured normalized battery voltage ($V_n$) reaches the predetermined normalized battery voltage discharge level ($V_{nd}$) at the end discharge time ($T_{end}$).

10. The method as described in claim 1, wherein terminating the battery discharge when the measured normalized battery voltage ($V_n$) reaches the predetermined normalized battery voltage discharge level ($V_{nd}$) at the end discharge time ($T_{end}$) comprises:

restoring a primary supply of power to a load in a battery-backed electrical system when the measured normalized battery voltage ($V_n$) reaches the predetermined normalized battery voltage discharge level ($V_{nd}$) at the end discharge time ($T_{end}$).

11. The method as described in claim 2, further comprising:

displaying the battery reserve time (t) to a user access interface.

12. The method as described in claim 1 wherein the desired percent of battery discharge ($\%_{dd}$) is limited to about 30% or less.

13. A method of predicting the reserve time or remaining capacity of a battery producing a voltage, comprising:

a) predetermining a desired percent of battery discharge ($\%_{dd}$) of a total available capacity for the battery;

b) predetermining a normalized battery voltage discharge level ($V_{nd}$) corresponding to the desired percent of battery discharge ($\%_{dd}$) using a universal normalized discharge curve;

c) initiating a battery discharge at a start discharge time ($T_{start}$);

d) monitoring the voltage of the battery voltage measured ($V_m$) at a time measured ($T_m$) throughout the discharge;

e) identifying a peak voltage ($V_p$) of the battery discharge;

f) determining a measured normalized battery voltage ($V_n$) by normalizing the battery voltage measured with the peak voltage ($V_p$);

g) terminating the battery discharge when the measured normalized battery voltage ($V_n$) reaches the predetermined battery voltage discharge level ($V_{nd}$) at an end discharge time ($T_{end}$);

h) determining a reserve time (t) of the battery from a total amount of time expended during the discharge ($T_{dis}$);

i) determining a time expended during the discharge ($T_{dis}$) as the difference between the end discharge time ($T_{end}$) and the start discharge time ($T_{start}$) as in the following relation:

$$T_{dis} = T_{end} - T_{start};$$

and j) determining the reserve time (t) of the battery calculated from the total time expended during the discharge ($T_{dis}$) multiplied by a ratio of 100 divided by the percent discharge desired ($\%_{dd}$) as in the following relation:

$$t = T_{dis}(100/\%_{dd}).$$

14. A method of monitoring the status of a battery producing a voltage, comprising:

a) predetermining a normalized battery voltage discharge level ($V_{nd}$) corresponding to a desired percent of battery discharge ($\%_{dd}$) using a universal normalized discharge curve;

b) initiating a battery discharge at a start discharge time ($T_{start}$);

c) monitoring the voltage of the battery voltage measured ($V_m$) at a time measured ($T_m$) throughout the discharge;

d) identifying a foothill voltage ($V_{fh}$) of the battery discharge;

e) determining a measured normalized battery voltage ($V_n$) by normalizing the battery voltage measured with the foothill voltage ($V_{fh}$) by dividing the battery voltage measured ($V_m$) by the foothill voltage ($V_{fh}$); and f) terminating the battery discharge when the measured normalized battery voltage ($V_n$) reaches the predetermined normalized battery voltage discharge level ($Vf_{nd}$) at an end discharge time ($T_{end}$).

15. The method as described in claim 14, further comprising:

g) determining a reserve time (t) of the battery from a total amount of time expended during the discharge ($T_{dis}$).

16. The method as described in claim 15, wherein determining the reserve time (t) of the battery from the total amount of time expended during the discharge ($T_{dis}$) comprises:

i) determining the time expended during the discharge ($T_{dis}$) as the difference between the end discharge time ($T_{end}$) and the start discharge time ($T_{start}$) as in the following relation:

$$T_{dis} = T_{end} - T_{start};$$

and ii) determining a reserve time (t) of the battery calculated from the total time expended during the discharge ($T_{dis}$) multiplied by a ratio of 100 divided by the percent discharge desired ($\%_{dd}$) as in the following relation:

$$t = T_{dis}(100/\%_{dd}).$$

17. The method as described in claim 14, wherein determining the normalized battery voltage discharge level ($V_{nd}$) corresponding to a desired percent of battery discharge ($\%_{dd}$) using a universal normalized discharge curve comprises:

i) providing a universal normalized discharge curve comprising data indicative of a correlation between a percent of battery discharge time versus a normalized battery voltage;

ii) finding a data point on the universal normalized discharge curve corresponding to the desired percent of battery discharge ($\%_{dd}$);

iii) setting the normalized battery voltage discharge level ($V_{nd}$) equal to the normalized battery voltage associated with said data point.

18. The method as described in claim 14, wherein identifying the foothill voltage ($V_{fh}$) of the battery discharge comprises:

i) setting the value of the foothill voltage ($V_{fh}$) to the battery voltage measured ($V_m$);

ii) comparing each consecutive battery voltage measured ($V_m$) with the foothill voltage ($V_{fh}$);

iii) resetting the value of the foothill voltage ($V_{fh}$) to the value of a battery voltage measured ($V_m$) when a battery voltage measured ($V_m$) is less than the foothill voltage ($V_{fh}$).

19. The method as described in claim 15, further comprising:
displaying the battery reserve time (t) to a user access interface.

20. The method as described in claim 14, wherein the desired percent of battery discharge ($\%_{dd}$) is limited to about 30% or less.

21. A method of predicting the reserve time or remaining capacity of a battery producing a voltage, comprising:
  a) predetermining a desired percent of battery discharge ($\%_{dd}$) of the total available capacity for the battery;
  b) predetermining a normalized battery voltage discharge level ($V_{nd}$) corresponding to the desired percent of battery discharge ($\%_{dd}$) using a universal normalized discharge curve;
  c) initiating a battery discharge at a start discharge time ($T_{start}$);
  d) monitoring the voltage of the battery voltage measured ($V_m$) at a time measured ($T_m$) throughout the discharge;
  e) identifying a foothill voltage ($V_{fh}$) of the battery discharge;
  f) determining a measured normalized battery voltage ($V_n$) by normalizing the battery voltage measured with the foothill voltage ($V_{fh}$);
  g) terminating the battery discharge when the measured normalized battery voltage ($V_n$) reaches the predetermined battery voltage discharge level ($V_{nd}$) at an end discharge time ($T_{end}$);
  h) determining a reserve time (t) of the battery from a total amount of time expended during the discharge ($T_{dis}$);
  i) determining a time expended during the discharge ($T_{dis}$) as the difference between the end discharge time ($T_{end}$) and the start discharge time ($T_{start}$) as in the following relation:

$$T_{dis}=T_{end}-T_{start};$$

and
  j) determining a reserve time (t) of the battery calculated from the total time expended during the discharge ($T_{dis}$) multiplied by a ratio of 100 divided by the percent discharge desired ($\%_{dd}$) as in the following relation:

$$t=T_{dis}(100/\%_{dd}).$$

22. A method of monitoring the status of a battery producing a voltage, comprising:
  a) predetermining a normalized battery voltage discharge level ($V_{nd}$) corresponding to a desired percent of battery discharge ($\%_{dd}$) of about 30% or less using a universal normalized discharge curve;
  b) initiating a battery discharge at a start discharge time ($T_{start}$);
  c) monitoring the voltage of the battery voltage measured ($V_m$) at a time measured ($T_m$) throughout the discharge;
  d) identifying a peak voltage ($V_p$) of the battery discharge;
  e) determining a measured normalized battery voltage ($V_n$) by normalizing the battery voltage measured with the peak voltage ($V_p$); and
  f) terminating the battery discharge when the measured normalized battery voltage ($V_n$) reaches the predetermined normalized battery voltage discharge level ($V_{nd}$) at an end discharge time ($T_{end}$).

23. The method as described in claim 22, further comprising:
  g) determining a reserve time (t) of the battery from a total amount of time expended during the discharge ($T_{dis}$).

24. The method as described in claim 23, wherein determining the reserve time (t) of the battery from the total amount of time expended during the discharge ($T_{dis}$) comprises:
  i) determining the time expended during the discharge ($T_{dis}$) as the difference between the end discharge time ($T_{end}$) and the start discharge time ($T_{start}$) as in the following relation:

$$T_{dis}=T_{end}-T_{start};$$

and
  ii) determining the reserve time (t) of the battery calculated from the total time expended during the discharge ($T_{dis}$) multiplied by a ratio of 100 divided by the percent discharge desired ($\%_{dd}$) as in the following relation:

$$t=T_{dis}(100/\%_{dd}).$$

25. The method as described in claim 22, wherein determining the normalized battery voltage discharge level ($V_{nd}$) corresponding to a desired percent of battery discharge ($\%_{dd}$) using a universal normalized discharge curve comprises:
  i) providing a universal normalized discharge curve comprising data indicative of a correlation between a percent of battery discharge time versus a normalized battery voltage;
  ii) finding a data point on the universal normalized discharge curve corresponding to the desired percent of battery discharge ($\%_{dd}$);
  iii) setting the normalized battery voltage discharge level ($V_{nd}$) equal to the normalized battery voltage associated with said data point.

26. The method as described in claim 22, wherein initiating a battery discharge at the start discharge time ($T_{start}$) comprises:
placing a load on the battery at the start discharge time ($T_{start}$).

27. The method as described in claim 22, wherein initiating a battery discharge at a start discharge time ($T_{start}$) comprises:
removing a primary supply of power to a load in a battery-backed electrical system at the start discharge time ($T_{start}$).

28. The method as described in claim 22, wherein identifying the peak voltage ($V_p$) of the battery discharge comprises:
  i) setting the value of the peak voltage ($V_p$) to the battery voltage measured ($V_m$);
  ii) comparing each consecutive battery voltage measured ($V_m$) with the peak voltage ($V_p$);
  iii) resetting the value of the peak voltage ($V_p$) to the value of a battery voltage measured ($V_m$) when a battery voltage measured ($V_m$) is greater than the peak voltage ($V_p$).

29. The method as described in claim 22 wherein determining a measured normalized battery voltage ($V_n$) by normalizing the battery voltage measured with the peak voltage ($V_p$) comprises:

determining the measured normalized battery voltage ($V_n$) calculated as the battery voltage measured ($V_m$) divided by the peak voltage ($V_p$) according to the following relation:

$$V_n = V_m/V_p.$$

30. The method as described in claim 22, wherein terminating the battery discharge when the measured normalized battery voltage ($V_n$) reaches the predetermined normalized battery voltage discharge level ($V_{nd}$) at the end discharge time ($T_{end}$) comprises:
   i) comparing the measured normalized battery voltage ($V_n$) to the predetermined normalized battery voltage discharge level ($V_{nd}$); and
   ii) terminating the battery discharge when the measured normalized battery voltage ($V_n$) is less than or equal to the predetermined normalized battery voltage discharge level ($V_{nd}$), at the end discharge time ($T_{end}$).

31. The method as described in claim 22, wherein terminating the battery discharge when the measured normalized battery voltage ($V_n$) reaches the predetermined normalized battery voltage discharge level ($V_{nd}$) at the end discharge time ($T_{end}$) comprises:
   removing a load from the battery when the measured normalized battery voltage ($V_n$) reaches the predetermined normalized battery voltage discharge level ($V_{nd}$) at the end discharge time ($T_{end}$).

32. The method as described in claim 22, wherein terminating the battery discharge when the measured normalized battery voltage ($V_n$) reaches the predetermined normalized battery voltage discharge level ($V_{nd}$) at the end discharge time ($T_{end}$) comprises:
   restoring a primary supply of power to a load in a battery-backed electrical system when the measured normalized battery voltage ($V_n$) reaches the predetermined normalized battery voltage discharge level ($V_{nd}$) at the end discharge time ($T_{end}$).

33. The method as described in claim 23, further comprising:
   displaying the battery reserve time (t) to a user access interface.

34. A method of monitoring the status of a battery producing a voltage, comprising:
   a) predetermining a normalized battery voltage discharge level ($V_{nd}$) corresponding to a desired percent of battery discharge ($\%_{dd}$) of about 30% or less using a universal normalized discharge curve;
   b) initiating a battery discharge at a start discharge time ($T_{start}$);
   c) monitoring the voltage of the battery voltage measured ($V_m$) at a time measured ($T_m$) throughout the discharge;
   d) identifying a foothill voltage ($V_{fh}$) of the battery discharge;
   e) determining a measured normalized battery voltage ($V_n$) by normalizing the battery voltage measured with the foothill voltage ($V_{fh}$); and
   f) terminating the battery discharge when the measured normalized battery voltage ($V_n$) reaches the predetermined normalized battery voltage discharge level ($V_{nd}$) at an end discharge time ($T_{end}$).

35. The method as described in claim 34, further comprising:

g) determining a reserve time (t) of the battery from a total amount of time expended during the discharge ($T_{dis}$).

36. The method as described in claim 35, wherein determining the reserve time (t) of the battery from the total amount of time expended during the discharge ($T_{dis}$) comprises:
   i) determining the time expended during the discharge ($T_{dis}$) as the difference between the end discharge time ($T_{end}$) and the start discharge time ($T_{start}$) as in the following relation:

$$T_{dis} = T_{end} - T_{start};$$

and
   ii) determining the reserve time (t) of the battery calculated from the total time expended during the discharge ($T_{dis}$) multiplied by a ratio of 100 divided by the percent discharge desired ($\%_{dd}$) as in the following relation:

$$t = T_{dis}(100/\%_{dd}).$$

37. The method as described in claim 34, wherein determining the normalized battery voltage discharge level ($V_{nd}$) corresponding to a desired percent of battery discharge ($\%_{dd}$) using a universal normalized discharge curve comprises:
   i) providing a universal normalized discharge curve comprising data indicative of a correlation between a percent of battery discharge time versus a normalized battery voltage;
   ii) finding a data point on the universal normalized discharge curve corresponding to the desired percent of battery discharge ($\%_{dd}$);
   iii) setting the normalized battery voltage discharge level ($V_{nd}$) equal to the normalized battery voltage associated with said data point.

38. The method as described in claim 34, wherein identifying the foothill voltage ($V_{fh}$) of the battery discharge comprises:
   i) setting the value of the foothill voltage ($V_{fh}$) to the battery voltage measured ($V_m$);
   ii) comparing each consecutive battery voltage measured ($V_m$) with the foothill voltage ($V_{fh}$);
   iii) resetting the value of the foothill voltage ($V_{fh}$) to the value of a battery voltage measured ($V_m$) when a battery voltage measured ($V_m$) is less than the foothill voltage ($V_{fh}$).

39. The method as described in claim 34 wherein determining a measured normalized battery voltage ($V_n$) by normalizing the battery voltage measured with the foothill voltage ($V_{fh}$) comprises:
   determining the measured normalized battery voltage ($V_n$) calculated as the battery voltage measured ($V_m$) divided by the foothill voltage ($V_{fh}$) according to the following relation:

$$V_n = V_m/V_{fh}.$$

40. The method as described in claim 35, further comprising:
   displaying the battery reserve time (t) to a user access interface.

* * * * *